United States Patent
Park

(10) Patent No.: US 8,970,257 B2
(45) Date of Patent: Mar. 3, 2015

(54) SEMICONDUCTOR DEVICE FOR OFFSET COMPENSATION OF REFERENCE CURRENT

(71) Applicant: SK hynix Inc., Gyeonggi-do (KR)

(72) Inventor: Jae-Boum Park, Gyeonngi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/094,343

(22) Filed: Dec. 2, 2013

(65) Prior Publication Data

US 2014/0375371 A1 Dec. 25, 2014

(30) Foreign Application Priority Data

Jun. 24, 2013 (KR) .......................... 10-2013-0072078

(51) Int. Cl.
*H03K 5/01* (2006.01)
*H03K 3/012* (2006.01)

(52) U.S. Cl.
CPC ..................................... *H03K 3/012* (2013.01)
USPC ............................. 327/100; 327/101; 327/362

(58) Field of Classification Search
USPC .......................... 327/100, 103, 306, 332, 362
See application file for complete search history.

(56) References Cited

U.S. PATENT DOCUMENTS

| | | | |
|---|---|---|---|
| 7,279,984 B2 * | 10/2007 | Grillo et al. | 330/308 |
| 7,696,909 B2 * | 4/2010 | Oberhuber | 341/119 |
| 2013/0060498 A1 * | 3/2013 | Lokken et al. | 702/86 |

FOREIGN PATENT DOCUMENTS

| | | |
|---|---|---|
| KR | 1020040093862 | 11/2004 |
| KR | 1020110021050 | 3/2011 |

* cited by examiner

*Primary Examiner* — Dinh Le
(74) *Attorney, Agent, or Firm* — IP & T Group LLP

(57) ABSTRACT

A semiconductor device includes a reference current generator suitable for generating a reference current, a current-voltage converter suitable for generating a first reference voltage and a second reference voltage in response to the reference current, and an analog-digital converter suitable for generating a digital code value based on a voltage difference between the first and second reference voltages, wherein the reference current generator includes a current control unit for controlling the reference current in response to the digital code value.

13 Claims, 4 Drawing Sheets

(A)

(B)

SEMICONDUCTOR DEVICE FOR OFFSET COMPENSATION OF REFERENCE CURRENT

CROSS-REFERENCE TO RELATED APPLICATIONS

The present application claims priority of Korean Patent Application No. 10-2013-0072078, filed on Jun. 24, 2013, which is incorporated herein by reference in its entirety.

BACKGROUND

1. Field

Exemplary embodiments of the present invention relate to a semiconductor device for generating a reference current, and more particularly, to a technology for offset compensation of a reference current.

2. Description of the Related Art

A reference voltage generator generates a reference voltage that is used as a reference power source in a semiconductor memory device. Generally, the reference voltage generator receives an external voltage and generates an internal voltage whose level is lower than the level of the external voltage.

Semiconductor memory devices tend to operate at low voltage and consume low power. An internal voltage generator receives a high external voltage that is inputted from the outside of a semiconductor memory chip and generates an internal voltage level that is used in the semiconductor memory chip, in order to reduce the power consumption of the semiconductor memory chip while improving the operation performance of the semiconductor memory chip.

In particular, in the field of high-density memory devices, an internal voltage down-converter using an external power supply VDD is being used. The internal voltage down-converter is used as a voltage source for an internal circuit. The internal voltage down-converter generates a low level voltage thus reducing the power consumption of a semiconductor memory device and preventing the life-span of a device from being shortened due to high voltage stress.

However, the current-voltage characteristics of a P-type metal-oxide semiconductor (PMOS) transistor, which is provided as an active load in a conventional voltage down-converter, changes due to an external factor such as a variation in a process. Even in a slight change in the characteristics, the output voltage of the PMOS transistor may change in response to the same level of the input voltage thereof. This signifies that the generated internal voltage may be different for each chip, even though the circuit of the same structure is used.

FIG. 1 is a circuit diagram illustrating a typical Widlar-type reference voltage generator. The reference voltage generator generates a reference voltage $V_{REF}$ of a constant level based on an external power supply voltage VDD and a ground voltage VSS.

Referring to FIG. 1, when the power supply voltage VDD is applied, a reference voltage node outputs a reference voltage $V_{REF}$ decreasing from the power supply voltage VDD by a threshold voltage of a second PMOS transistor MP2 because the second PMOS transistor MP2 operates as a diode.

Since the reference voltage node is coupled with a gate of a first PMOS transistor MP1, the first PMOS transistor MP1 is turned on in response to the voltage level VDD-VTH of the reference voltage node and transfers a current of a certain amount to a node A.

The second negative-channel metal-oxide semiconductor (NMOS) transistor MN2 is also diode-coupled. Thus, at the reference voltage node coupled with a drain of the second PMOS transistor MP2, clamping occurs at a level equal to or higher than the threshold voltage of the second NMOS transistor MN2.

The reference voltage node is coupled with the gates of first NMOS transistors MN1A, MN1B and MN1C so as to form a great resistor, and the first NMOS transistor MN1 is coupled with a resistor R0 to make temperature compensation.

While a current flows through a conductor in inverse proportion to temperature, the current flows through a semiconductor in proportion to temperature.

Therefore, it is possible to detect a zero temperature coefficient at which the current is not affected by temperature.

When the first NMOS transistor MN1 is not turned on, the first NMOS transistor MN1 functions as a semiconductor or a nonconductor, and when the first NMOS transistor MN1 is turned on, the first NMOS transistor MN1 functions as a conductor. Therefore, the first NMOS transistor MN1 may develop a temperature compensation effect in combination with the load R0, which is a substantial conductor.

The Widlar-type reference voltage generator, which described above, is typically used in memory devices and other CMOS-based devices.

Generally, a current having a constant level irrelevant to the variation of PVT (Process, Voltage, and Temperature) is referred to as a reference current.

As described above, in order to generate the reference current and maintain its characteristics as a reference, there is to be no local mismatch between transistors and the characteristics of the transistors used in a current mirror should be the same.

In general processes, however, there is a mismatch between the characteristics of mirror transistors that are used in a current mirror, and an offset, i.e., a deviation from a target value, occurs in a sensitive current mirror-type circuit. Therefore, the reference current may not be generated stably.

The offset of a circuit deteriorates the characteristics of the reference current, and increases the possibility of erroneous operation to occur, thus adversely affecting mass-productivity of a chip and product reliability.

SUMMARY

An embodiment of the present invention is directed to a semiconductor device capable of compensating an offset of a reference current by compensating for a mismatch among constituent elements of a reference current generator, i.e., transistors.

In accordance with an embodiment of the present invention, a semiconductor device includes a reference current generator suitable for generating a reference current, a current-voltage converter suitable for generating a first reference voltage and a second reference voltage in response to the reference current, and an analog-digital converter suitable for generating a digital code value based on a voltage difference between the first and second reference voltages, wherein the reference current generator includes a current control unit for controlling the reference current in response to the digital code value.

The current control unit may include a plurality of transistors that are enabled in response to the digital code value. The reference current may be transferred from the reference current generator to the current-voltage converter in response to a bias signal.

The current-voltage converter may include a first reference voltage generation unit suitable for generating the first reference voltage in response to the reference current and a second reference voltage generation unit suitable for generating the second reference voltage in response to the reference current. The first reference voltage generation unit may include an active device, and the second reference voltage generation unit includes a passive device. The reference current generator may be a Widlar-type reference current generation circuit.

In accordance with another embodiment of the present invention, a method for compensating an offset of a current includes generating a reference current, converting the reference current into a first reference voltage and a second reference voltage in different proportions, generating a digital code value based on a voltage difference between the first reference voltage and the second reference voltage, and adjusting the reference current based on the digital code value.

In accordance with further embodiment of the present invention, a semiconductor device includes a reference current generator suitable for generating a reference current in response to a digital code value, a current-voltage converter suitable for converting the reference current into a first reference voltage and a second reference voltage in different proportions, and an analog-digital converter suitable for generating a digital code value based on a voltage difference between the first and second reference voltages.

DETAILED DESCRIPTION

Figure 1:
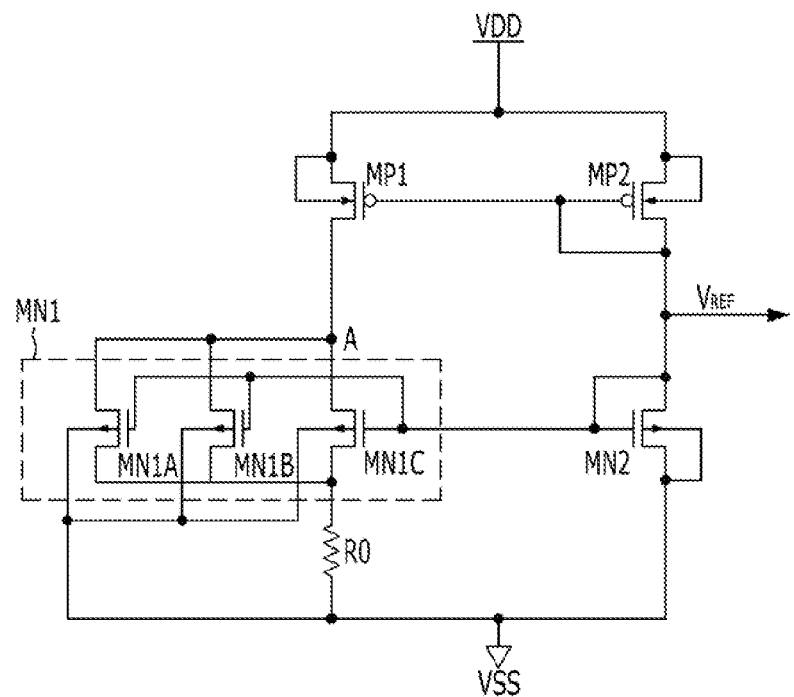
FIG. 1 is a circuit diagram illustrating a typical Widlar-type reference voltage generator.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 2:
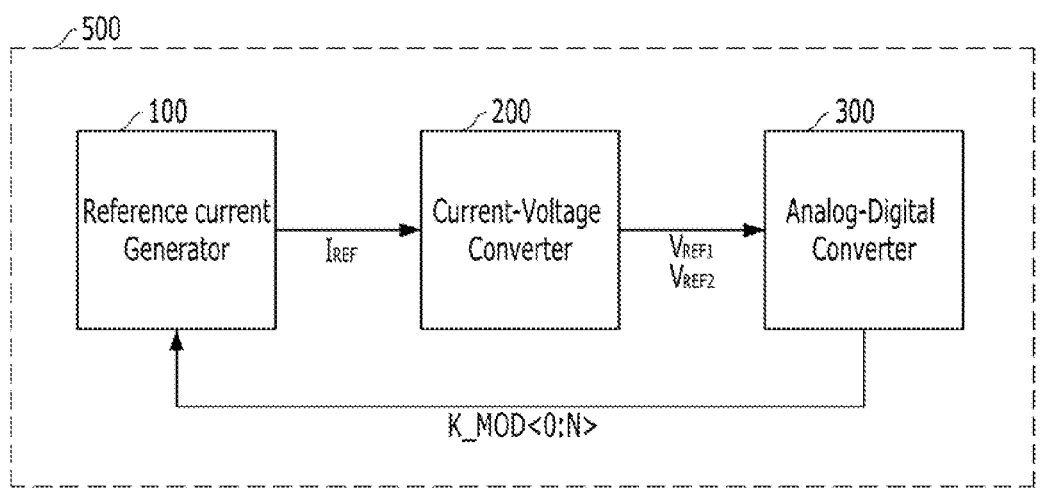
FIG. 2 is a block diagram illustrating a semiconductor device in accordance with an embodiment of the present invention.

FIG. 2 is a block diagram illustrating a semiconductor device 500 in accordance with an embodiment of the present invention.

Referring to FIG. 2, the semiconductor device 500 includes a reference current generator 100, a current-voltage converter 200, and an analog-digital converter 300.

Hereafter, the reference current generator 100 according to the embodiment of the present invention is a Widlar-type reference current generation circuit.

The reference current generator 100 generates a reference current $I_{REF}$. The reference current generator 100 includes a current control unit 110 (shown in FIG. 3) for adjusting the reference current $I_{REF}$ in response to a digital code value K_MOD<0:N> received from the analog-digital converter 300.

The current-voltage converter 200 receives the reference current $I_{REF}$ and converts it into a first reference voltage $V_{REF1}$ and a second reference voltage $V_{REF2}$.

The analog-digital converter 300 receives the first reference voltage $V_{REF1}$ and the second reference voltage $V_{REF2}$, calculates a voltage level difference between the first reference voltage $V_{REF1}$ and the second reference voltage $V_{REF2}$, converts the voltage level difference into a digital code value K_MOD<0:N>, and outputs it to the reference current generator 100.

Figure 3:
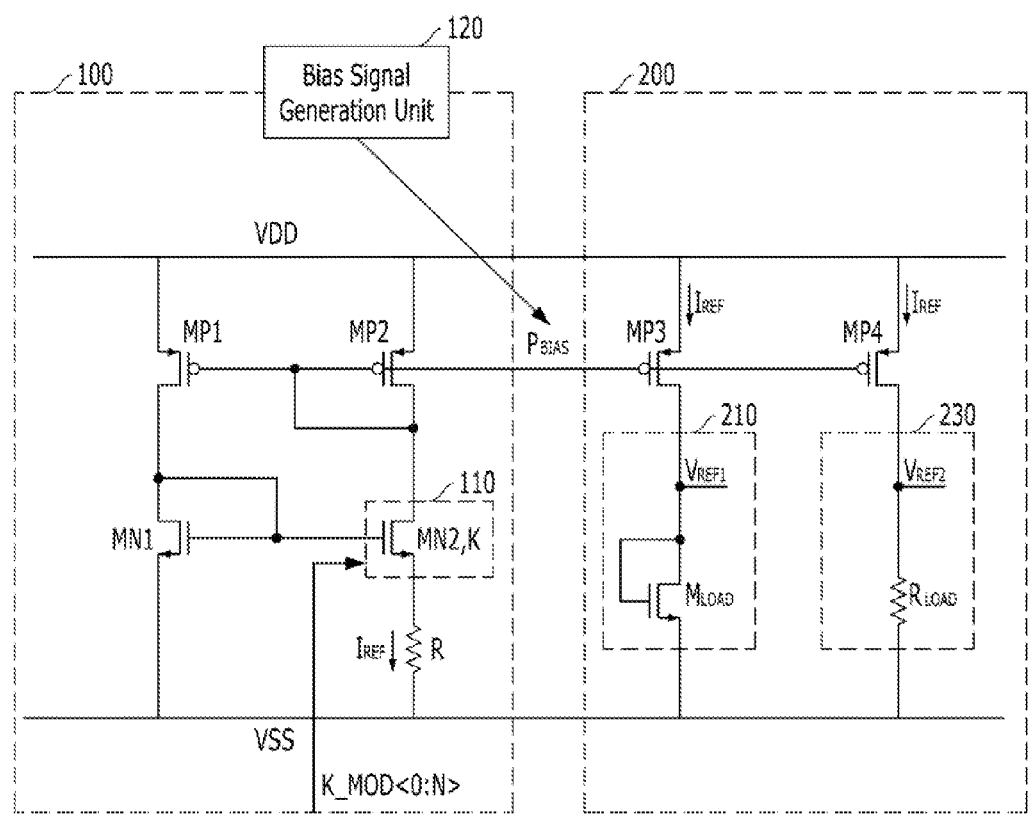
FIG. 3 is a circuit diagram illustrating a reference current generator and a current-voltage converter shown in FIG. 2.

FIG. 3 is a circuit diagram illustrating the reference current generator 100 and the current-voltage converter 200 shown in FIG. 2.

Referring to FIG. 3, the reference current generator 100 generates the reference current $I_{REF}$, and includes the current control unit 110 for adjusting the generated reference current $I_{REF}$. Also, the reference current generator 100 receives a bias signal $P_{BIAS}$ from a bias signal generation unit 120, generates the reference current $I_{REF}$ based on the bias signal $P_{BIAS}$, and transfers the generated reference current $I_{REF}$ to the current-voltage converter 200.

The bias signal generation unit 120 generates the bias signal $P_{BIAS}$ that is used as a gate signal of a second PMOS transistor MP2 included in the reference current generator 100.

The reference current generator 100 includes a first PMOS transistor MP1, the second PMOS transistor MP2, a first NMOS transistor MN1, and the current control unit 110.

The current control unit 110 may include a plurality of second NMOS transistors MN2 whose gates are coupled in common with each other, and the current control unit 110 controls the second NMOS transistors MN2 that are turned on to adjust the reference current $I_{REF}$ in response to the received digital code value K_MOD<0:N>.

The first PMOS transistor MP1 and the second PMOS transistor MP2 have their sources coupled with a power supply voltage VDD. The first PMOS transistor MP1 and the second PMOS transistor MP2 form a current mirror, and their gates are coupled in common with the drain of the second PMOS transistor MP2.

Also, the drain of the first PMOS transistor MP1 is coupled with the gate of the first NMOS transistor MN1, and the source of the first NMOS transistor MN1 is coupled with the ground voltage VSS.

The current control unit 110 including K second NMOS transistors MN2 is coupled with the drain of the second PMOS transistor MP2, and the gate of the first NMOS transistor MN1.

A resistance R is disposed between the source of the second NMOS transistor MN2 and the ground voltage VSS.

The current-voltage converter 200 includes a first reference voltage generation unit 210 and a second reference voltage generation unit 230. The first reference voltage generation unit 210 generates the first reference voltage $V_{REF1}$ based on the reference current $I_{REF}$ applied from the reference current generator 100. The second reference voltage generation unit 230 generates the second reference voltage $V_{REF2}$ based on the reference current $I_{REF}$ applied from the reference current generator 100.

The first reference voltage generation unit 210 includes an active device $M_{LOAD}$, i.e., a diode, and the second reference voltage generation unit 230 includes a passive device $R_{LOAD}$, i.e., a resistor.

The current-voltage converter 200 includes a third PMOS transistor MP3 and a fourth PMOS transistor MP4 whose gates are coupled in common with the gates of the first PMOS transistor MP1 and the second PMOS transistor MP2 of the reference current generator 100.

The sources of the third PMOS transistor MP3 and the fourth PMOS transistor MP4 are coupled with the power supply voltage VDD.

The active device $M_{LOAD}$ coupled between the third PMOS transistor MP3 and the ground voltage VSS. The passive device $R_{LOAD}$ is coupled between the fourth PMOS transistor MP4 and the ground voltage VSS.

A node for generating the first reference voltage $V_{REF1}$ is provided between the third PMOS transistor MP3 and the active device $M_{LOAD}$. A node for generating the second reference voltage $V_{REF2}$ is provided between the fourth PMOS transistor MP4 and the passive device $R_{LOAD}$.

That is, an output node for generating the first reference voltage $V_{REF1}$ is disposed between the third PMOS transistor MP3 and the active device $M_{LOAD}$, and an output node for generating the second reference voltage $V_{REF2}$ is disposed between the fourth PMOS transistor MP4 and the passive device $R_{LOAD}$.

Hereafter, the operations of the reference current generator 100 and the current-voltage converter 200 are described in detail.

The reference current generator 100 secures the constant current flowing identically through two current flow paths by coupling the drain and gate of the transistors disposed at the diagonal positions among the four transistors forming current mirrors. For example, among the first PMOS transistor MP1 and the second PMOS transistor MP2 forming a current mirror, and the first NMOS transistor MN1 and the second NMOS transistor MN2 forming another current mirror, the drain and gate of the first PMOS transistor MP1 and the second NMOS transistor MN2 or the drain and gate of the second PMOS transistor MP2 and the first. NMOS transistor MN1 may be coupled.

A case where the MOS transistors included in the reference current generator 100 have the same characteristics is now described.

The gates of the third PMOS transistor MP3 and the fourth PMOS transistor MP4 of the current-voltage converter 200 are coupled in common with the gates of the first PMOS transistor MP1 and the second PMOS transistor MP2 of the reference current generator 100. Therefore, the current-voltage converter 200 receives the reference current $I_{REF}$ of the reference current generator 100 in response to a bias signal $P_{BIAS}$.

As a result, the same reference current $I_{REF}$ flows through the reference current generator 100 and the current-voltage converter 200 by adjusting a gate-source voltage $V_{GS}$ between the third PMOS transistor MP3 and the fourth PMOS transistor MP4 to be the same and by adjusting a gate-source voltage $V_{GS}$ between the first NMOS transistor MN1 and the second NMOS transistor MN2 to be the same.

The current-voltage converter 200 receives the bias signal $P_{BIAS}$ based on the generated reference current $I_{REF}$ and supplies the reference current $I_{REF}$ to the active device $M_{LOAD}$ and the passive device $R_{LOAD}$.

The same reference current $I_{REF}$ flows through the active device $M_{LOAD}$ and the passive device $R_{LOAD}$ because there is no change in the characteristics of the MOS transistors of the reference current generator 100, and the first reference voltage $V_{REF1}$ and the second reference voltage $V_{REF2}$ have almost the same voltage level. That is, the same current flows through the active and passive devices regardless of change in the characteristics of the MOS transistors of the reference current generator 100. This is due to the third PMOS transistor MP3 and the fourth PMOS transistor MP4 having the same characteristics and supplying the same current in response to the same signal $P_{BIAS}$.

Hereafter, a case where a mismatch occurs in the MOS transistors of the reference current generator 100 is described.

When there is a difference in the threshold voltages of the MOS transistors in the reference current generator 100, that is, when a mismatch occurs in the mirror transistors that form a current mirror, an offset is caused in the value of the generated reference current $I_{REF}$.

The current-voltage converter 200 receiving the bias signal $P_{BIAS}$ based on the generated reference current $I_{REF}$ provides the active device $M_{LOAD}$ and the passive device $R_{LOAD}$ with the reference current $I_{REF}$ including the offset.

When the reference current $I_{REF}$ flows through the active device $M_{LOAD}$ and the passive device $R_{LOAD}$, the voltage level of the first reference voltage $V_{REF1}$ and the voltage level of the second reference voltage $V_{REF2}$ become different. The active device $M_{LOAD}$ and the passive device $R_{LOAD}$, generate the first and second reference voltages $V_{REF1}$ and $V_{REF2}$ in different proportions to the reference current $I_{REF}$ since they have different current-voltage characteristics. This will be described below with reference to FIG. 4A and FIG. 4B.

Figure 4A:
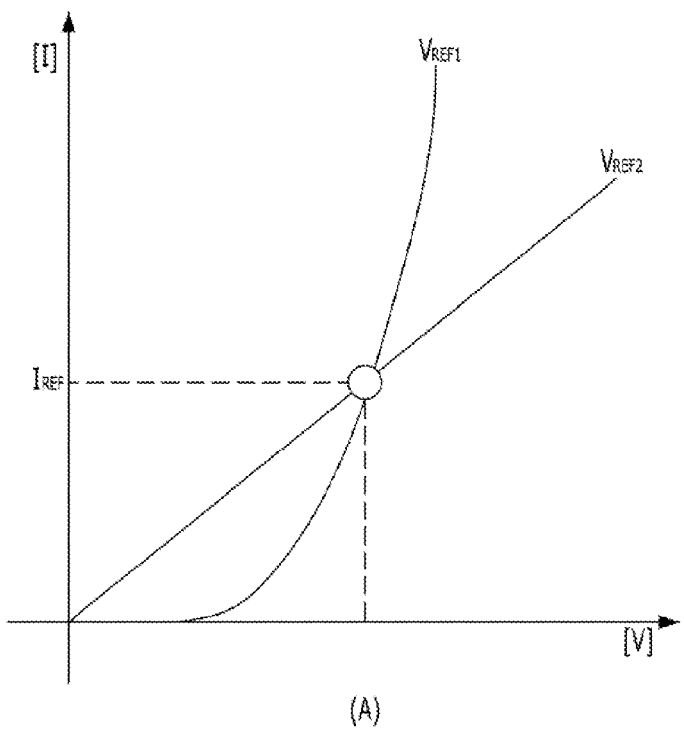
FIGS. 4A and 4B are graphs illustrating current-voltage characteristics of the current-voltage converter.
Figure 4B:
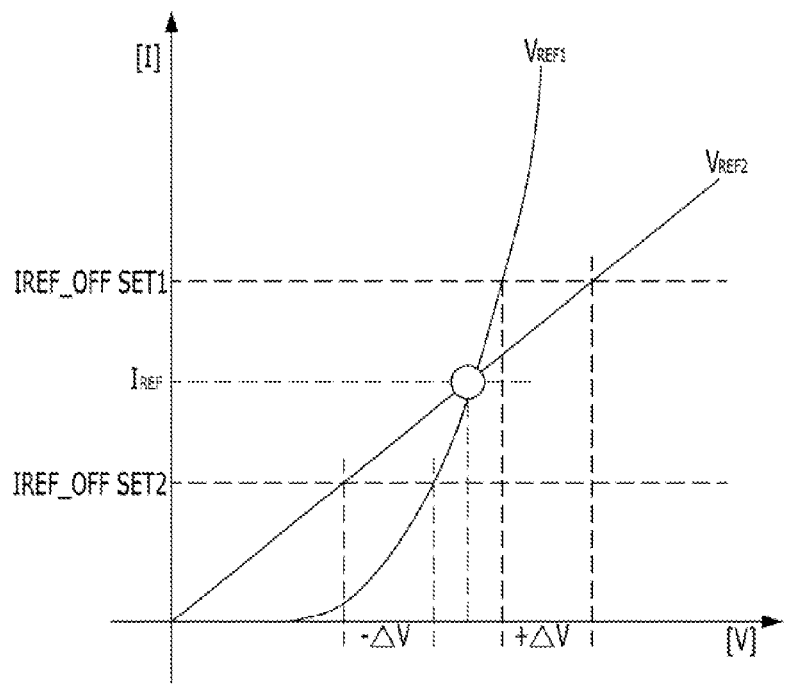

FIGS. 4A and 4B are graphs illustrating current-voltage its characteristics of the current-voltage converter 200. The graphs of FIGS. 4A and 4B show the current-voltage characteristics of a diode that is the active device $M_{LOAD}$ and the current-voltage characteristics of a resistor that is the passive device $R_{LOAD}$.

The graph of FIG. 4A shows a case where no mismatch occurs in the mirror transistors (which are the first PMOS transistor MP1 and the second PMOS transistor MP2 or the first NMOS transistor MN1 and the second NMOS transistor MN2) of the reference current generator 100.

Since the reference current $I_{REF}$ of a target level is supplied from the reference current generator 100, the current-voltage converter 200 generates the first reference voltage $V_{REF1}$ and the second reference voltage $V_{REF2}$ of the same voltage level all the times.

The graph of FIG. 4B shows a case where a mismatch occurs in the mirror transistors (which are the first PMOS transistor MP1 and the second PMOS transistor MP2 or the first NMOS transistor MN1 and the second NMOS transistor MN2) of the reference current generator 100.

It may be seen from the offset IREF_OFFSET1 and IREF_OFFSET2 of the reference current which is caused by the occurrence of a mismatch that there is a difference $-\Delta V$ and $+\Delta V$ between the first reference voltage $V_{REF1}$ and the second reference voltage $V_{REF2}$ that are generated by the active device $M_{LOAD}$ and the passive device $R_{LOAD}$.

The semiconductor device according to an embodiment of the present invention decreases the difference $\Delta V$ between the reference voltages caused due to the offset of the reference current $I_{REF}$ by controlling the number of the second NMOS transistors MN2 of the current control unit 110 that turn on.

To describe this by using equations, a general drain-source current in an operation region (saturation region of a transistor), which is a region where a current flowing through a transistor is decided based on a gate-source voltage, is as shown below.

$$V_{GS} \geq V_{TH}$$

$$V_{DS} = V_{GS} - V_{TH}$$

$$I_{DS} = \frac{\beta}{2}(V_{GS} - V_{TH})^2$$

$$\beta = \frac{W}{L}\mu_n C_{OX}$$

where $\beta$ is a unit gain coefficient; $\mu n$ is an average surface mobility; L is a channel length in a direction that the current flows between the source and the drain; and W is a channel width that is perpendicular to L.

It is assumed in the embodiment of the present invention that the W and L of the MOS transistors used in the reference current generator 100 and the current-voltage converter 200 are all matched to be the same (L1=L2=L6 and W2=KW1=W6).

The gate-source voltages of the first NMOS transistor MN1 and the second NMOS transistor MN2 of the reference current generator 100 may be represented as follows based on the above general drain-source current equation.

$$V_{GS1} = \sqrt{\frac{2I_{DS}}{\beta}} + V_{TH1}$$

$$V_{GS2} = \sqrt{\frac{2I_{DS}}{K \cdot \beta}} + V_{TH2}$$

The gate-source voltage relation between the first NMOS transistor MN1 and the second NMOS transistor MN2 may be represented as follows based on the characteristics of a current mirror, $$V_{GS1} = I_{REF} \cdot R + V_{GS2}$$

$$I_{REF} = \frac{1}{R}(V_{GS1} - V_{GS2})$$

Since the drain-source current of the current mirror in the reference current generator 100 is the same as the reference current $I_{REF}$, the reference current $I_{REF}$ may be represented as follows.

$$I_{REF} = \frac{1}{R}\left\{\left(\sqrt{\frac{2I_{REF}}{\beta}} + V_{TH1}\right) - \left(\sqrt{\frac{2I_{REF}}{K \cdot \beta}} + V_{TH2}\right)\right\}$$

When no mismatch occurs in the transistors, the threshold voltages $V_{TH1}$ and $V_{TH2}$ are the same, and thus the reference current of a constant level represented as the following equation flows, regardless of the threshold voltages of the transistors.

$$I_{REF} = \frac{2}{R^2 \cdot \beta}\left(1 - \sqrt{\frac{1}{K}}\right)^2$$

However, there is a change in the reference cur $I_{REF}$, when the threshold voltages $V_{TH1}$ and $V_{TH2}$ of the transistors are different. Therefore, there is a mismatch in the transistors.

According to the embodiment of the present invention, the reference current $I_{REF}$ having the offset is compensated by adjusting the value of a constant K, which is the number of the NMOS transistors turning on.

That is, as shown in the equations, among the variables that decide the reference current, there are variables that are not related to temperature. The variables unrelated to temperature include the K factor, which is the number of the transistors, and the W and L.

Generally, since the W and L are matched between transistors, the variable that may be easily adjusted by the designer is the K factor. Therefore, the reference current $I_{REF}$ is controlled by adjusting the K factor based on the variance of the first reference voltage $V_{REF1}$ and the second reference voltage $V_{REF2}$ that are obtained by converting the reference current $I_{REF}$ into voltage.

The reference current generator 100 controls the reference current $I_{REF}$ by being fed back with a digital code value K_MOD<0:N>, which is obtained by converting the variance of the voltage.

Figure 5:
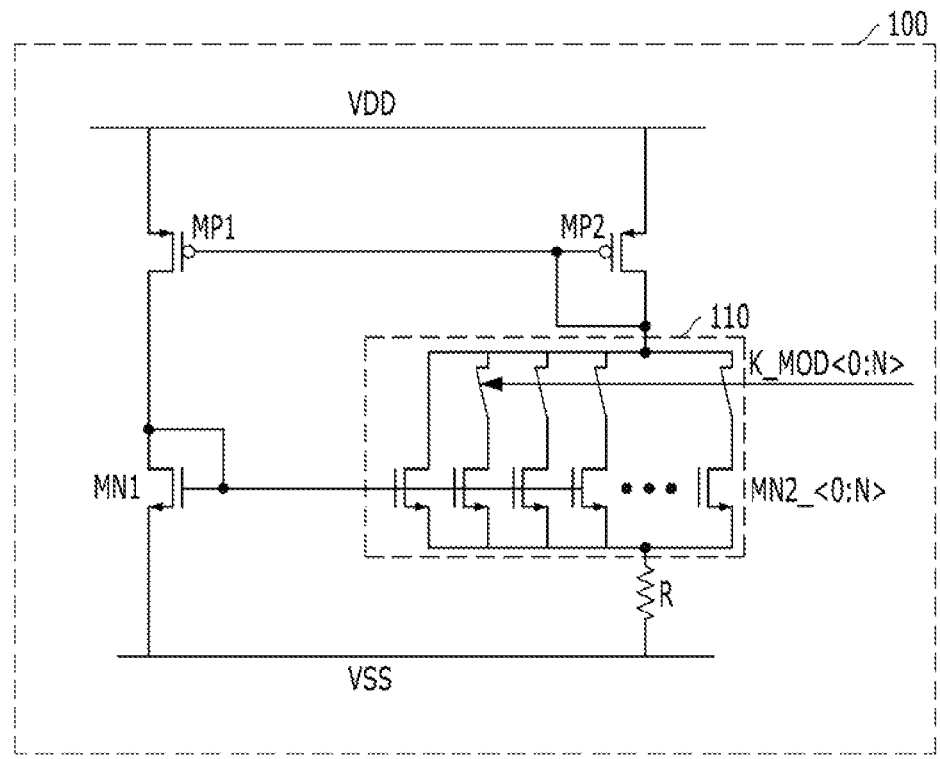
FIG. 5 is a circuit diagram illustrating a current control unit shown in FIG. 3.

FIG. 5 is a circuit diagram illustrating the current control unit 110 shown in FIG. 3.

Referring to FIG. 5, the current control unit 110 receives the digital code value K_MOD<0:N> from the analog-digital converter 300 and controls the reference current $I_{REF}$ based on the number of the NMOS transistors connected to the second PMOS transistor MP2.

When the reference current $I_{REF}$ is increased, the number of the second NMOS transistors MN2_<0:N> that are enabled according to the digital code value K_MOD<0:N> is decreased.

Conversely, when the reference current $I_{REF}$ is decreased, the reference current $I_{REF}$ is controlled by increasing the number of the second NMOS transistors MN2_<0:N> being enabled.

As the feedback operation is performed repeatedly, the current converges into a level where the first reference voltage $V_{REF1}$ and the second reference voltage $V_{REF2}$ are similar to some extent.

In summary, correction or compensation is carried out to generate the reference current $I_{REF}$ of a target level by controlling the offset reference current through the feedback.

The current variance caused by controlling the number of the transistors being enabled is to be set sufficiently small so that a system does not become unstable. The semiconductor device suggested in diverse embodiments of the present invention may be applied to various memory devices, such as a Dynamic Random Access Memory (DRAM) device and a flash memory device.

Figure 6:
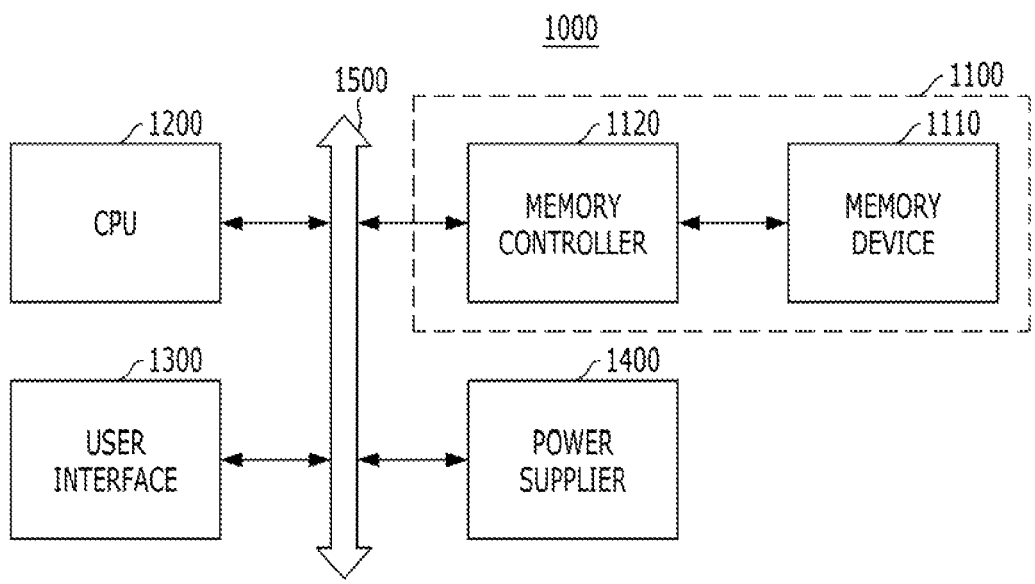
FIG. 6 is a block diagram illustrating an information processing system to which a semiconductor device according to an embodiment of the present invention is applied.

FIG. 6 is a block diagram illustrating an information processing system to which a semiconductor device according to an embodiment of the present invention is applied.

Referring to FIG. 6, the information processing system 1000 may include a memory system 1100, a central processing unit 1200, a user interface 1300, and a power supplier 1400. The memory system 1100, the central processing unit 1200, the user interface 1300, and the power supplier 1400 communicate data with each other through a bus 1500.

The memory system 1100 may include a memory device 1110 and a memory controller 1120. The memory device 1110 may store data processed by the central processing unit 1200 or external data inputted through the user interface 1300.

The memory device 1110 includes the aforementioned diverse semiconductor devices suggested in accordance with the embodiments of the present invention.

The information processing system 1000 may be comprised of many types of electronic devices for data storage. For example, it may be applied to a memory card, a solid-state disk (SSD) or diverse mobile device such as a smart phone.

According to an embodiment of the present invention, a semiconductor device may generate a stable reference current by minimizing the mismatch among mirror transistors caused by a variation in a process.

Moreover, the semiconductor device may be applied to diverse memory devices, such as a Dynamic Random Access Memory (DRAM) device and a flash memory device, or other semiconductor integrated circuits. The semiconductor device improves the reliability, while reducing yield loss in accordance with an embodiment of the present invention.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
a reference current generator suitable for generating one reference current;
a current-voltage converter suitable for generating a first reference voltage and a second reference voltage in response to the one reference current; and
an analog-digital converter suitable for generating a digital code value based on a voltage difference between the first and second reference voltages, wherein the reference current generator includes a current control unit for controlling the one reference current in response to the digital code value.

2. The semiconductor device of claim 1, wherein the current control unit includes a plurality of transistors that are enabled in response to the digital code value.

3. The semiconductor device of claim 1, wherein the one reference current is transferred from the reference current generator to the current-voltage converter in response to a bias signal.

4. The semiconductor device of claim 1, wherein the current-voltage converter includes:
a first reference voltage generation unit suitable for generating the first reference voltage in response to the one reference current; and
a second reference voltage generation unit suitable for generating the second reference voltage in response to the one reference current.

5. The semiconductor device of claim 4, wherein the first reference voltage generation unit includes an active device, and the second reference voltage generation unit includes a passive device.

6. The semiconductor device of claim 1, wherein the reference current generator is a Widlar-type reference current generation circuit.

7. A method for compensating an offset of a current comprising:
generating one reference current;
converting the one reference current into a first reference voltage and a second reference voltage;
generating a digital code value based on a voltage difference between the first reference voltage and the second reference voltage; and
adjusting the one reference current based on the digital code value.

8. The method of claim 7, wherein the converting of the one reference current into the first reference voltage and the second reference voltage includes:
generating a bias signal to transfer the one reference current; and
generating the first reference voltage and the second reference voltage based on the transferred one reference current in response to the bias signal.

9. The method of claim 8, wherein the generating of the first reference voltage and the second reference voltage in response to the bias signal includes:
generating the first reference voltage using an active device; and
generating the second reference voltage using a passive device.

10. The method of claim 7, wherein the adjusting of the one reference current based on the digital code value includes:
enabling a plurality of transistors for the one reference current to flow through based on the digital code value.

11. A semiconductor device, comprising:
a reference current generator suitable for generating one reference current in response to a digital code value;
a current-voltage converter suitable for converting the one reference current into a first reference voltage and a second reference voltage in different proportions; and
an analog-digital converter suitable for generating a digital code value based on a voltage difference between the first and second reference voltages.

12. The semiconductor device of claim 11, wherein the current-voltage converter includes:
a first reference voltage generation unit suitable for generating the first reference voltage with first current-voltage characteristics in response to the one reference current; and
a second reference voltage generation unit suitable for generating the second reference voltage with second current-voltage characteristics different from the first current-voltage characteristics in response to the one reference current.

13. The semiconductor device of claim 11, wherein the reference current generator adjusts the one reference current in response to the digital code value and includes a current control unit suitable for enabling a plurality of transistors for the one reference current to flow through based on the digital code value.

* * * * *